(12) United States Patent
Chung

(10) Patent No.: US 7,994,568 B2
(45) Date of Patent: Aug. 9, 2011

(54) VERTICAL TRANSISTOR OF SEMICONDUCTOR DEVICE AND METHOD FOR FORMING THE SAME

(75) Inventor: Woo Young Chung, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/425,994

(22) Filed: Apr. 17, 2009

(65) Prior Publication Data

US 2009/0206396 A1 Aug. 20, 2009

Related U.S. Application Data

(62) Division of application No. 11/152,097, filed on Jun. 15, 2005, now Pat. No. 7,524,725.

(30) Foreign Application Priority Data

Mar. 31, 2005 (KR) .................. 10-2005-0027049

(51) Int. Cl.
*H01L 29/78* (2006.01)
(52) U.S. Cl. ........ 257/328; 257/331; 257/353; 257/413; 257/623; 257/E29.131
(58) Field of Classification Search .................. 257/328, 257/331, 353, 412–413, 623, E29.131
See application file for complete search history.

(56) References Cited

U.S. PATENT DOCUMENTS

| 4,670,768 | A | * | 6/1987 | Sunami et al. ................ 257/331 |
| 4,975,754 | A | | 12/1990 | Ishiuchi |
| 5,047,812 | A | * | 9/1991 | Pfiester ......................... 257/329 |
| 5,169,795 | A | * | 12/1992 | Nishizawa et al. ........... 438/586 |
| 5,177,027 | A | * | 1/1993 | Lowrey et al. ................ 438/270 |
| 5,391,506 | A | | 2/1995 | Tada et al. |
| 5,416,350 | A | * | 5/1995 | Watanabe ...................... 257/330 |
| 5,466,961 | A | * | 11/1995 | Kikuchi et al. ............... 257/379 |
| 5,545,586 | A | * | 8/1996 | Koh .............................. 438/156 |
| 5,571,730 | A | * | 11/1996 | Park et al. ..................... 438/269 |
| 5,598,037 | A | * | 1/1997 | Kikuchi et al. ............... 257/773 |

(Continued)

FOREIGN PATENT DOCUMENTS

JP 64-035957 A 2/1989

(Continued)

OTHER PUBLICATIONS

Wolf et al., "Refractory Metals and Their Silicides in VLSI Fabrication", Silicon Processing for the VLSI Era: vol. 1—Process Technology, Lattice Press, 1996, pp. 384-386.

*Primary Examiner* — Toniae M Thomas
(74) *Attorney, Agent, or Firm* — Kilpatrick Townsend & Stockton LLP

(57) ABSTRACT

A vertical transistor of a semiconductor device and a method for forming the same are disclosed. The vertical transistor comprises a silicon fin disposed on a semiconductor substrate, a source region disposed in the semiconductor substrate below a lower portion of the silicon fin, a drain region disposed in an upper portion of the silicon fin, a channel region disposed in a sidewall of the silicon fin between the source region and the drain region, a gate oxide film disposed in a surface of the semiconductor substrate and the sidewall of the silicon fin, and a pair of gate electrodes disposed on the gate oxide films.

19 Claims, 6 Drawing Sheets

U.S. PATENT DOCUMENTS

| | | | |
|---|---|---|---|
| 5,929,477 A * | 7/1999 | McAllister Burns et al. | 257/306 |
| 6,107,133 A | 8/2000 | Furukawa | |
| 6,191,446 B1 * | 2/2001 | Gardner et al. | 257/330 |
| 6,440,801 B1 * | 8/2002 | Furukawa et al. | 438/272 |
| 6,472,258 B1 * | 10/2002 | Adkisson et al. | 438/192 |
| 6,548,856 B1 | 4/2003 | Lin et al. | |
| 6,821,834 B2 | 11/2004 | Ando | |
| 6,998,311 B2 * | 2/2006 | Forbes et al. | 438/268 |
| 7,075,148 B2 * | 7/2006 | Hofmann et al. | 257/331 |
| 7,141,856 B2 | 11/2006 | Lee et al. | |
| 2003/0075758 A1 * | 4/2003 | Sundaresan et al. | 257/329 |
| 2003/0124804 A1 | 7/2003 | Soo | |
| 2004/0007737 A1 * | 1/2004 | Cho et al. | 257/328 |
| 2004/0157353 A1 * | 8/2004 | Ouyang et al. | 438/38 |
| 2005/0142771 A1 | 6/2005 | Kim | |
| 2006/0046392 A1 | 3/2006 | Manning et al. | |
| 2007/0051994 A1 * | 3/2007 | Song et al. | 257/296 |

FOREIGN PATENT DOCUMENTS

| | | |
|---|---|---|
| JP | 4-155870 A | 5/1992 |
| JP | 6-163912 A | 6/1994 |
| JP | 2000-277712 A | 10/2000 |

* cited by examiner

VERTICAL TRANSISTOR OF SEMICONDUCTOR DEVICE AND METHOD FOR FORMING THE SAME

CROSS-REFERENCES TO RELATED APPLICATIONS

The present application claims priority to Korean patent application number 10-2005-0027049, filed on Mar. 31, 2005, and is a divisional of U.S. patent application Ser. No. 11/152,097, filed on Jun. 15, 2005, both of which are incorporated by reference in their entirety.

BACKGROUND OF THE INVENTION

1. Field of the Invention

The present invention generally relates to a vertical transistor of a semiconductor device and a method for forming the same, and more specifically, to a vertical transistor of a semiconductor device and a method for forming the same wherein a pair of vertical gates comprising a gate polysilicon layer and a gate metal layer are disposed on sidewalls of a silicon fin to improve driving current capability of the semiconductor device.

2. Description of the Related Art

Generally, one of the most important parameters in fabricating a transistor is a threshold voltage. The threshold voltage is a variable depending on a thickness of a gate oxide film, a channel doping concentration, an oxide charge, and a material used for gate.

As the size of semiconductor device is decreased, phenomena inconsistent with a theory occur. One of the inconsistent phenomenons at hand is a short channel effect ("SCE") that occurs due to decrease in a gate channel length.

As integration density of the semiconductor device is increased, a transistor having a high operation speed and a low operation voltage is required. However, it becomes difficult to form the transistor having a high operation speed and a low operation voltage by using conventional methods due to the SCE.

Moreover, the SCE causes a Hot Carrier Effect ("HCE") Hot carrier refers to a carrier or an electron/hole having a high energy due to acceleration when an electric field is applied.

The hot carrier is one of several factors that have significant effect on the characteristics of semiconductor device. The hot carrier causes a Drain Induced Barrier Lowering ("DIBL") and a Gate Induced Barrier Lowering ("GIBL"), which deteriorate an electric characteristic of the semiconductor device.

In accordance with the above-described conventional transistor of a semiconductor device, problems such as SCE, HCE, DIBL and GIDL occur due to decrease in the size of the semiconductor device. As a result, the electric characteristics and reliability of the semiconductor device are deteriorated.

SUMMARY OF THE INVENTION

Accordingly, it is an object of the present invention to provide a vertical transistor of a semiconductor device and a method for forming the same wherein a pair of vertical gates comprising a gate polysilicon layer and a gate metal layer are disposed on both sidewalls of a silicon fin to improve driving current capability of the semiconductor device.

In order to achieve the above object of the present invention, there is provided a vertical transistor of a semiconductor device comprising:
  a silicon fin disposed on a semiconductor substrate,
  a source region disposed in the semiconductor substrate below a lower portion of the silicon fin,
  a drain region disposed in an upper portion of the silicon fin,
  a channel region disposed in a sidewall of the silicon fin between the source region and the drain region,
  a gate oxide film disposed on a surface of the semiconductor substrate and the sidewall of the silicon fin, and
  a pair of gate electrodes disposed on the gate oxide films.

In order to achieve above object of the present invention in accordance with a first preferred embodiment, there is provided a method for forming a vertical transistor of a semiconductor device, comprising the steps of:
  (a) etching a semiconductor substrate to form a silicon fin,
  (b) performing an angled ion implant process to form a source region in the semiconductor substrate below a lower portion of the silicon fin,
  (c) performing a channel ion implant process to form a channel region in a sidewall of the silicon fin,
  (d) performing an ion implant process to form a drain region in an upper portion of the silicon fin,
  (e) forming a gate oxide film on a surface of the semiconductor substrate and the sidewall of the silicon fin, and
  (f) forming a pair of gate electrodes on both sidewalls of the silicon fin, wherein the gate electrode comprises a gate polysilicon layer and a gate metal layer.

In order to achieve above object of the present invention in accordance with a second preferred embodiment, there is provided a method for forming a vertical transistor of a semiconductor device, comprising the steps of:
  (a) performing an ion implant process on the top of a semiconductor substrate to form a drain region therein,
  (b) etching the semiconductor substrate to form a silicon fin having the drain region disposed therein,
  (c) performing an angled ion implant process to form a source region in the semiconductor substrate below a lower portion of the silicon fin,
  (d) performing a channel ion implant process to form a channel region in a sidewall of the silicon fin,
  (e) forming a gate oxide film on a surface of the semiconductor substrate and the sidewall of the silicon fin, and
  (f) forming a pair of gate electrodes on both sidewalls of the silicon fin, wherein the gate electrode comprises a gate polysilicon layer and a gate metal layer.

DETAILED DESCRIPTION OF THE PREFERRED EMBODIMENTS

Reference will now be made in detail to exemplary embodiments of the present invention. Wherever possible, the same reference numbers will be used throughout the drawings to refer to the same or like parts.

Figure 1:
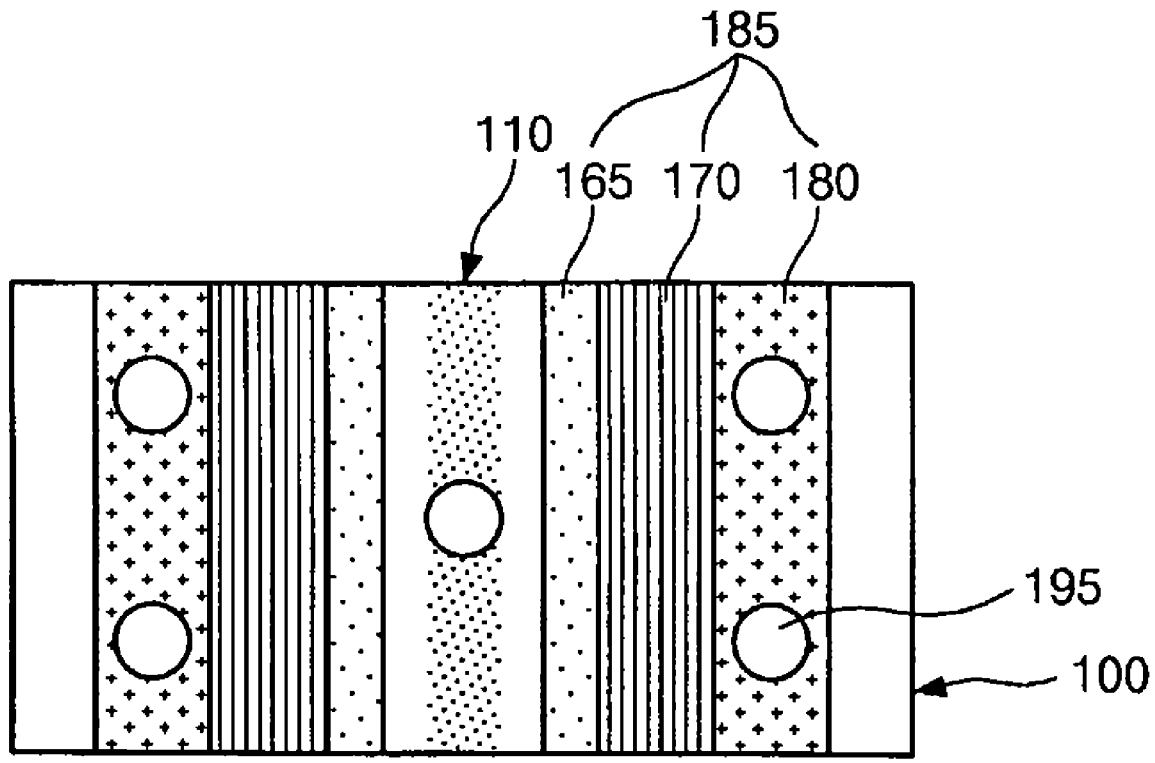
FIG. 1 is a plan view illustrating a vertical transistor of a semiconductor device in accordance with a preferred embodiment of the present invention.
Figure 2:
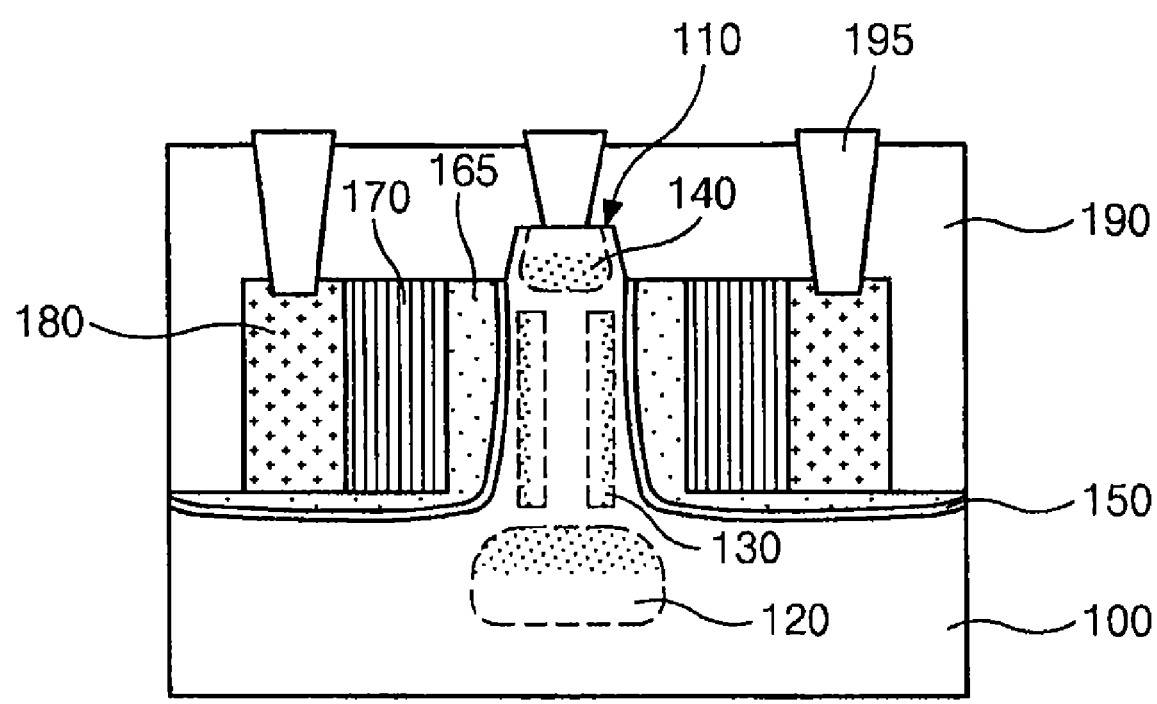
FIG. 2 is a cross-sectional view illustrating a vertical transistor of a semiconductor device in accordance with a preferred embodiment of the present invention.

FIGS. 1 and 2 are a plan view and a cross-sectional view illustrating a vertical transistor of a semiconductor device according to a preferred embodiment of the present invention, respectively.

Referring to FIGS. 1 and 2, the vertical transistor in accordance with the present invention comprises a silicon fin 110 disposed on a semiconductor substrate 100, a gate oxide film 165 disposed on a surface of the semiconductor substrate 100 and a sidewall of the silicon fin 110. A gate 185 comprising a stacked structure of a gate polysilicon layer 170 and a gate metal layer 180 is disposed on the sidewall of the silicon fin 110. Source and drain regions 120 and 140 are respectively disposed in the semiconductor substrate below a lower portion of the silicon fin 110 and on an upper portion of the silicon fin 110. A channel region 130 is disposed in a sidewall of the silicon fin 110 between the source region 120 and the drain region 140.

The vertical transistor may further comprise an interlayer insulating film 190 disposed on a surface of the gate 185, and a contact plug 195 contacting a predetermined portion of the drain region 140 and the gate metal layer 180 disposed in the interlayer insulating film 190.

FIGS. 3a through 3h are cross-sectional views illustrating a method for forming a vertical transistor of a semiconductor device according to a preferred embodiment of the present invention.

Figure 3A:
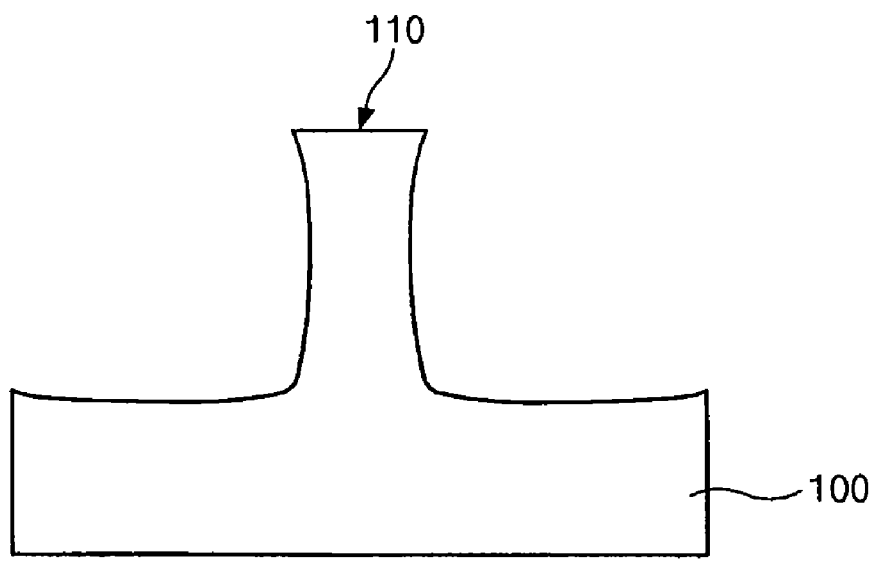
FIGS. 3a through 3h are cross-sectional views illustrating a method for forming a vertical transistor of a semiconductor device according to a preferred embodiment of the present invention.

Referring to FIG. 3a, a mask layer pattern covering a predetermined region of a semiconductor substrate 100 where a silicon fin 110 is to be formed is formed on a semiconductor substrate 100. The semiconductor substrate 100 is etched via an isotropic wet-etching process using the mask layer pattern as an etching mask to form the silicon fin 110. Preferably, the etching process is performed by controlling an etching ratio according to a design rule of the semiconductor substrate, so that an under-etch or over-etch of the silicon fin 110 does not occur. In accordance with a preferred embodiment, a height of the silicon fin 110 ranges from 13 µm to 17 µm, and a channel length may be increased or decreased according to the height of the silicon fin 110.

In addition, a buffer oxide film 150 may further be formed on an entire surface of the semiconductor substrate 100 including the silicon fin 110 to prevent that the semiconductor substrate 100 may be damaged in subsequent ion implant processes for forming a channel region 130 and source/drain regions 120 and 140.

Figure 3B:
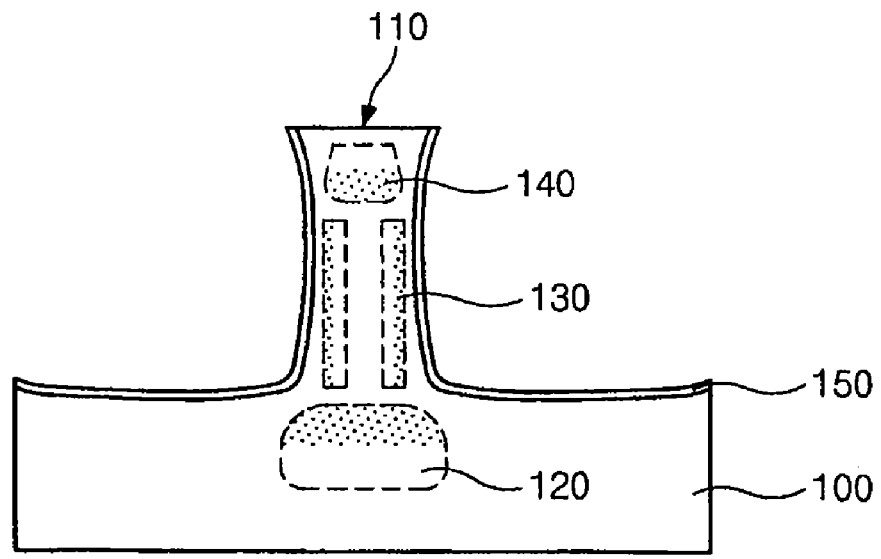

Referring to FIG. 3b, an angled ion implant process is performed to form the source region 120 in the semiconductor substrate 100 below a lower portion of the silicon 110. Preferably, the angled ion implant process is performed from four directions with a tilt angle ranging 30° to 45°.

Next, a channel ion implant process is performed to form the channel region 130 on a sidewall of the silicon fin 110. Here, the channel ion implant process is preferably performed with a tilt angle ranging from 15° to 20°.

Thereafter, a mask layer (not shown) exposing the top surface of the silicon fin 110 having the channel region 130 in the sidewall thereof is formed. An ion implant process is then performed using the mask layer as an implant mask to form the drain region 140.

Figure 3C:
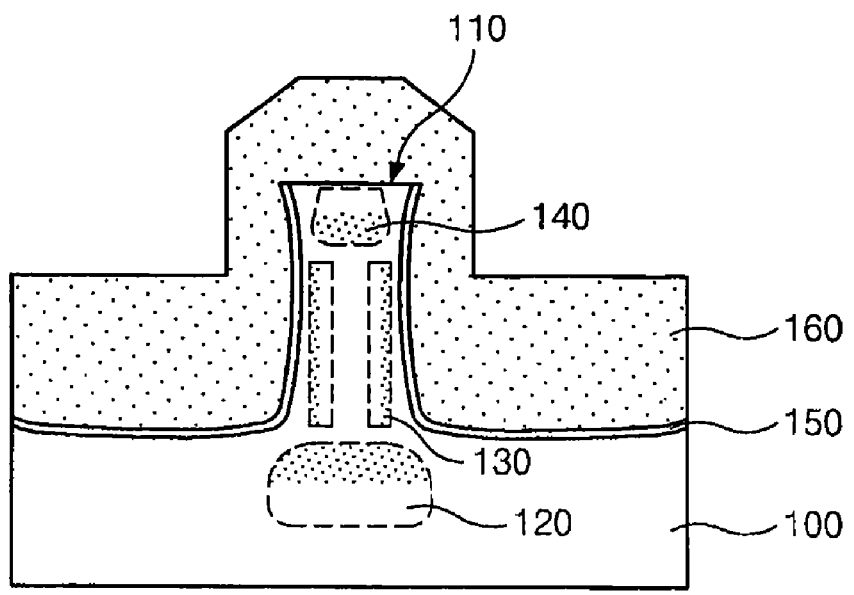

Referring to FIG. 3c, an oxide film 160 is formed on the entire surface of the semiconductor substrate 100.

Figure 3D:
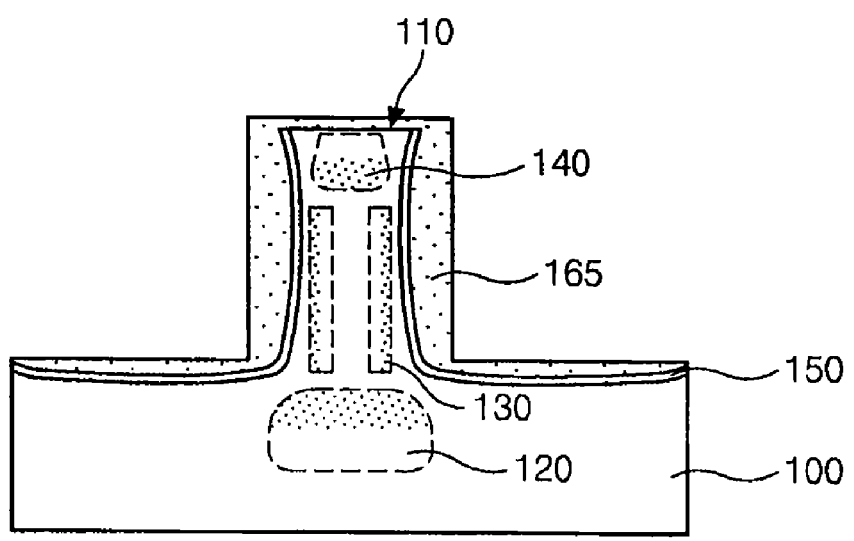

Referring to FIG. 3d, the oxide film 160 is etched to form a gate oxide film 165 on a surface of the semiconductor substrate 100 and the sidewall of the silicon fin 110. Preferably, a thickness of the gate oxide film 165 disposed on the sidewall of the silicon fin 110 ranges from 60 Å to 70 Å.

Figure 3E:
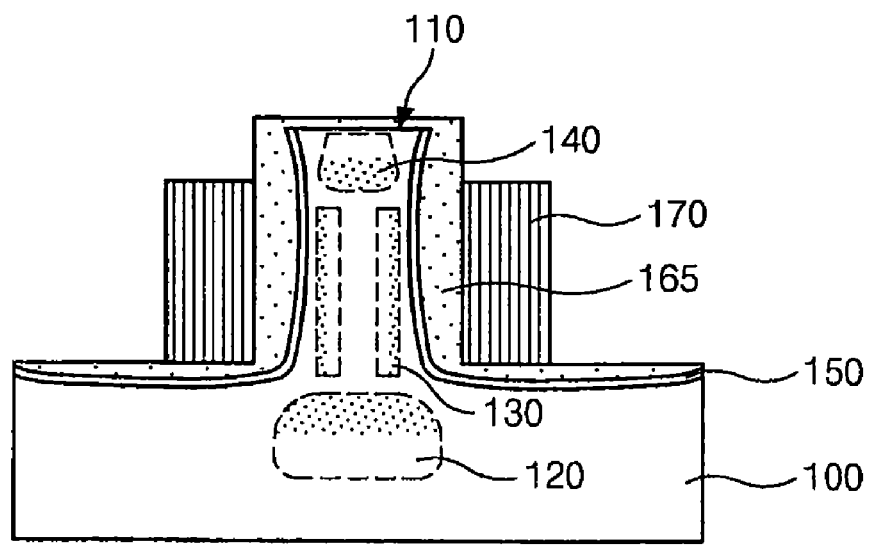

Referring to FIG. 3e, a mask layer exposing a predetermined region where a gate electrode is to be formed is deposited. A polysilicon layer (not shown) filling up the exposed region is then formed and planerized. Thereafter, the mask layer is removed to form a gate polysilicon layer 170 on the sidewall of the silicon fine 110. Preferably, a thickness of the gate polysilicon layer 170 ranges from 180 Å to 200 Å.

Figure 3F:
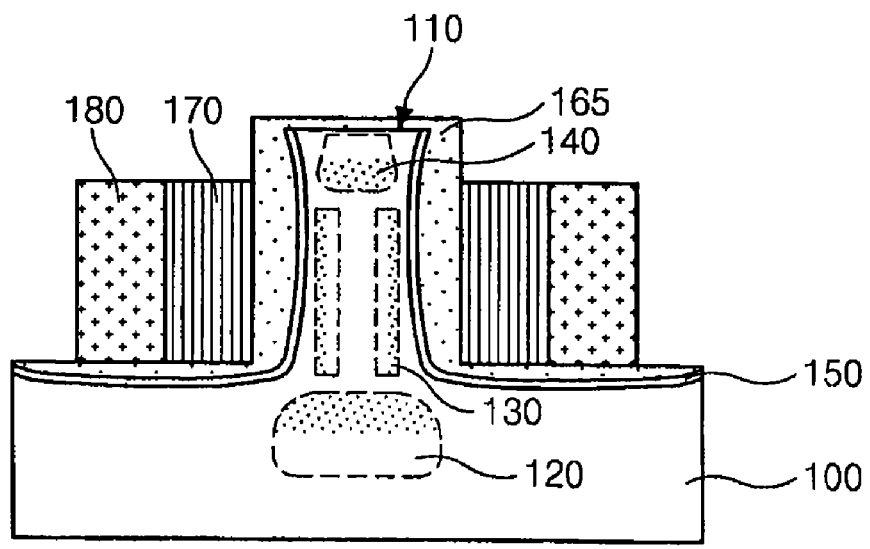

Referring to FIG. 3f, a mask layer (not shown) defining a gate metal layer region is formed. A metal layer (not shown) is then deposited and planerized. Thereafter, the mask layer is removed to form a gate metal layer 180 on the sidewall of the gate polysilicon 170. Preferably, a thickness of the gate metal layer 180 ranges from 200 Å to 230 Å.

Figure 3G:
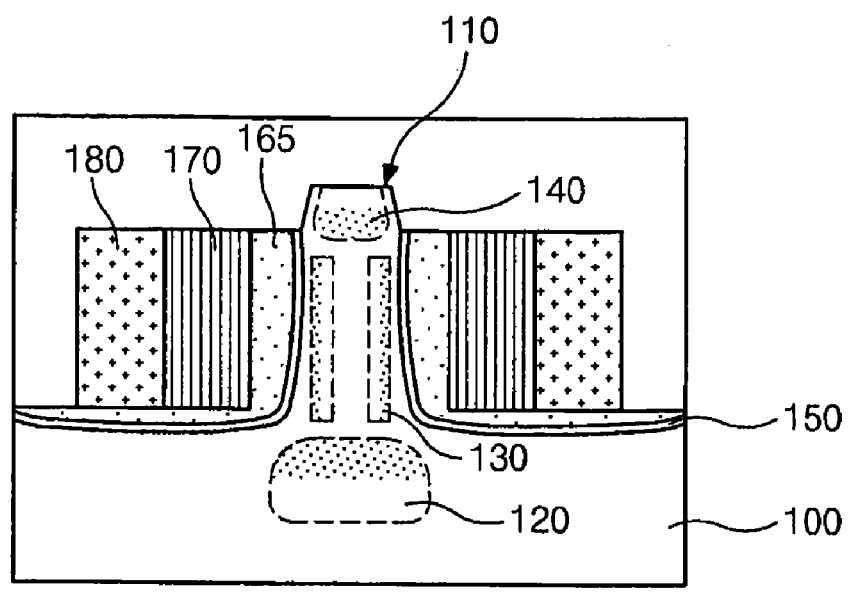

Referring to FIG. 3g, the gate oxide film 165 exposed by the gate polysilicon layer 170 and the gate metal layer 180 is removed. Thereafter, a CMP process is performed to polish top surface of the gate electrode.

Figure 3H:
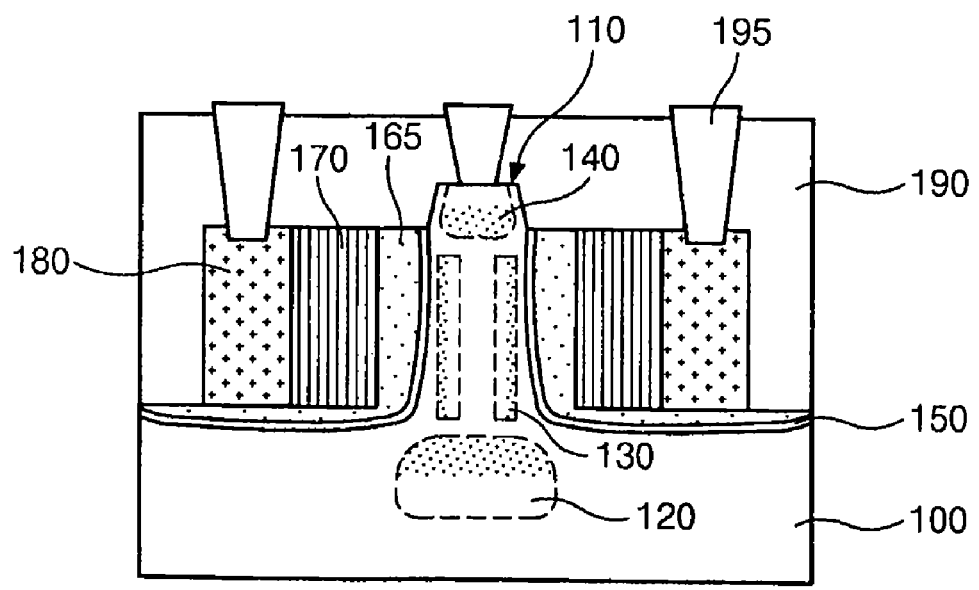

Referring to FIG. 3h, an interlayer insulating film 190 is formed on the entire surface of the semiconductor substrate 100. Thereafter, a contact plug 195 contacting a predetermined portion of the gate metal layer 180 and the drain region 140 is formed.

As described above, a vertical transistor according to a first preferred embodiment of the present invention can be formed.

In accordance with a second preferred embodiment of the present invention, the semiconductor substrate 110 is subjected to an ion implant process on the semiconductor substrate 100 to form the drain region 140 prior to an etching process of the silicon fin 110. The semiconductor substrate 100 including the drain region 140 is then etched to form the silicon fin 110. Thereafter, the processes similar to those of the first preferred embodiment of the present invention may be performed in subsequent processes.

In accordance with the preferred embodiments of the present invention, a pair of gates 185 comprising the gate oxide film 165, the gate polysilicon layer 170 and the gate metal layer 180 are formed on both sidewalls of the silicon fin 110 serving as a single active region. Accordingly, an electric characteristic of the device is improved by operating a pair of gates 185 in one transistor.

As described above, the vertical transistor of a semiconductor device and the method for forming the same in accordance with the present invention provides improved electric characteristics of the device by forming a pair of vertical gates that improve current driving capability and control ability of Turn-on/off characteristic of the gate.

In addition, the transistor of the present invention reduces the SCE even though the size of the semiconductor device is decreased, so as to prevent HCE, GIDL, and DIBL.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A vertical transistor of a semiconductor device, the vertical transistor comprising:
   a silicon fin disposed on a semiconductor substrate;
   a source region disposed in the semiconductor substrate below a lower portion of the silicon fin;
   a drain region disposed in an upper portion of the silicon fin;

a channel region disposed in a sidewall of the silicon fin between the source region and the drain region;

a gate oxide film disposed on a surface of the semiconductor substrate and opposite sidewalls of the silicon fin;

a buffer oxide layer disposed at an interface of the gate oxide film, and the semiconductor substrate and the silicon fin; and a pair of gate electrodes separately disposed on the gate oxide film and opposite sides of the silicon fin, each of the gate electrodes configured to control a current flow between the source region and the drain region.

2. The vertical transistor according to claim 1, wherein a height of the silicon fin ranges from 13 μm to 17 μm.

3. The vertical transistor according to claim 1, wherein at least one of the gate electrodes comprises a stacked structure of a gate polysilicon layer and a gate metal layer.

4. The vertical transistor according to claim 3, wherein a thickness of the gate polysilicon layer ranges from 180 Å to 200 Å.

5. The vertical transistor according to claim 3, wherein a thickness of the gate metal layer ranges from 200 Å to 230 Å.

6. The vertical transistor according to claim 3, wherein the gate metal layer is on a sidewall of the gate polysilicon layer.

7. The vertical transistor according to claim 3 further comprising:
an interlayer insulating film formed over the silicon fin and the pair of gate electrodes.

8. The vertical transistor according to claim 7 further comprising:
a contact plug contacting a predetermined portion of the gate metal layer and the drain region.

9. The vertical transistor according to claim 1, wherein a thickness of the gate oxide film ranges from 60 Å to 70 Å.

10. A vertical transistor of a semiconductor device, the vertical transistor comprising:
a silicon fin disposed on a semiconductor substrate;
a source region disposed in the semiconductor substrate below a lower portion of the silicon fin;
a drain region disposed in an upper portion of the silicon fin;
a channel region disposed in a sidewall of the silicon fin between the source region and the drain region;
a pair of gate electrodes coupled to opposite sides of the channel region;
a gate oxide film disposed on a surface of the semiconductor substrate and opposite sidewalls of the silicon fin; and
a buffer oxide layer disposed at an interface of the gate oxide film, and the semiconductor substrate and the silicon fin,
wherein the source region, the channel region and the drain region are arranged vertically.

11. The vertical transistor according to claim 10, wherein at least one of the gate electrodes comprises a stacked structure of a gate polysilicon layer and a gate metal layer.

12. The vertical transistor according to claim 11, wherein the gate metal layer is on a sidewall of the gate polysilicon layer.

13. The vertical transistor according to claim 10 further comprising:
a contact plug contacting a predetermined portion of the gate metal layer and the drain region.

14. The vertical transistor according to claim 10 further comprising:
an interlayer insulating film formed over the silicon fin and the pair of gate electrodes.

15. A vertical transistor of semiconductor device comprising:
a silicon fin disposed on a semiconductor substrate;
a source region disposed in the semiconductor substrate below a lower portion of the silicon fin;
a drain region disposed in an upper portion of the silicon fin;
a channel region disposed in a sidewall of the silicon fin between the source region and the drain region;
a gate oxide film disposed on a surface of the semiconductor substrate and the sidewall of the silicon fin;
a buffer oxide layer disposed at an interface of the gate oxide film, and the semiconductor substrate and the sidewall of the silicon fin; and
a pair of gate electrodes disposed on the gate oxide film,
wherein the source region and the drain region are shared by the pair of gate electrodes.

16. The vertical transistor according to claim 15, wherein the pair of gate electrodes are disposed at both sidewalls of the silicon fin.

17. The vertical transistor according to claim 15, wherein the pair of gate electrodes does not surround the silicon fin.

18. The vertical transistor according to claim 15, wherein the gate electrode comprises a stacked structure of a gate polysilicon layer and a gate metal layer.

19. The vertical transistor according to claim 15, wherein the gate metal layer is on the sidewall of the gate polysilicon layer.

* * * * *